(12) United States Patent
Flachowsky et al.

(10) Patent No.: US 9,054,044 B2
(45) Date of Patent: Jun. 9, 2015

(54) METHOD FOR FORMING A SEMICONDUCTOR DEVICE AND SEMICONDUCTOR DEVICE STRUCTURES

(71) Applicant: GLOBALFOUNDRIES Inc., Grand Cayman (KY)

(72) Inventors: Stefan Flachowsky, Dresden (DE); Jan Hoentschel, Dresden (DE); Ralf Richter, Radebeul (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 34 days.

(21) Appl. No.: 13/788,719

(22) Filed: Mar. 7, 2013

(65) Prior Publication Data

US 2014/0252557 A1  Sep. 11, 2014

(51) Int. Cl.
*H01L 29/06* (2006.01)
*H01L 21/308* (2006.01)
*H01L 29/78* (2006.01)
*H01L 29/66* (2006.01)

(52) U.S. Cl.
CPC ........ *H01L 21/3083* (2013.01); *H01L 29/0657* (2013.01); *H01L 29/7854* (2013.01); *H01L 29/66795* (2013.01)

(58) Field of Classification Search
CPC ............ H01L 21/3083; H01L 29/0657; H01L 29/66795; H01L 29/7854
USPC ......... 257/618, 368, 288, 347, 327, 401, 365; 438/157, 294, 585, 151, 268–269
See application file for complete search history.

(56) References Cited

U.S. PATENT DOCUMENTS

| 2008/0296667 | A1 | 12/2008 | Mikasa |
| 2011/0291196 | A1 | 12/2011 | Wei et al. |
| 2012/0115284 | A1* | 5/2012 | Chien et al. ................ 438/157 |
| 2013/0015534 | A1* | 1/2013 | Cheng et al. ............... 257/401 |
| 2013/0320453 | A1* | 12/2013 | Pethe et al. ................ 257/368 |
| 2014/0008734 | A1* | 1/2014 | Lu ............................. 257/401 |
| 2014/0103437 | A1* | 4/2014 | Kapoor et al. ............. 257/347 |
| 2014/0117426 | A1* | 5/2014 | Cho et al. .................. 257/288 |

OTHER PUBLICATIONS

Unpublished U.S. Appl. No. 13/231,750.

* cited by examiner

*Primary Examiner* — Mohammed Shamsuzzaman
(74) *Attorney, Agent, or Firm* — Amerson Law Firm, PLLC

(57) ABSTRACT

Semiconductor device structures and methods for forming a semiconductor device are provided. In embodiments, one or more fins are provided, each of the one or more fins having a lower portion and an upper portion disposed on the lower portion. The lower portion is embedded in a first insulating material. The shape of the upper portion is at least one of a substantially triangular shape and a substantially rounded shape and a substantially trapezoidal shape. Furthermore, a layer of a second insulating material different from the first insulating material is formed on the upper portion.

6 Claims, 10 Drawing Sheets

METHOD FOR FORMING A SEMICONDUCTOR DEVICE AND SEMICONDUCTOR DEVICE STRUCTURES

BACKGROUND OF THE INVENTION

1. Field of the Invention

The present invention generally relates to a method for forming a semiconductor device and to semiconductor device structures. Particularly, the present invention relates to forming shaped FinFETs, shaping formed fins and to semiconductor device structures having shaped fins.

2. Description of the Related Art

Transistors, such as metal oxide semiconductor field effect transistors (MOSFETs) or simply field effect transistors (FETs) or MOS transistors, represent the core building blocks for a vast majority of semiconductor integrated circuits. Generally, a FET includes source and drain regions between which a current flow is controlled by applying a bias to a gate electrode overlying a channel region between the source and drain regions. Conventional integrated circuits (ICs), such as high-performance microprocessors for example, may include a great number of FETs, usually on the order of millions. For such ICs, decreasing transistor size and, therefore, increasing integration density, has traditionally been a high priority in the semiconductor manufacturing industry. Nevertheless, transistor performance must be maintained with decreasing transistor size.

A FinFET is a type of transistor that addresses reducing the transistor size while maintaining transistor performance. In general, FinFETs represent three-dimensional transistors formed by thin fins extending upwardly from a semiconductor substrate. In a FinFET, the transistor channel is formed along the vertical sidewalls of the fin, which is also frequently referred to as a double gate transistor, or along the vertical sidewall surfaces and the upper horizontal surface of the fin, leading to a so-called tri-gate transistor. Double gate transistors and tri-gate transistors have a wide channel and, hence, high performance, which can be achieved without substantially increasing the area of the substrate surface required by the transistors because a transistor's performance, often measured by its transconductance, is proportional to the width of the transistor channel.

As opposed to planar MOS transistors, which are well known in the art and so their features need not be explained, FinFETs are less well known, so that the following brief explanations with regard to FIGS. 1a and 1b are provided to briefly discuss known FinFET structures.

FIG. 1a illustrates, in a cut-away perspective view, a portion of a FinFET integrated circuit (IC) 100a. The illustrated portion of IC 100a includes two fins 102a and 104a that are formed from a bulk semiconductor substrate 106a and extend upwardly therefrom. A gate electrode 108a overlies the two fins 102a and 104a and is electrically insulated from the fins 102a, 104a by a gate insulator (not illustrated). One end (denoted by 110a) of the fin 102a may be appropriately impurity doped to form the source of a field effect transistor (FET) 112a, while the other end (denoted by 114a) of that fin may be appropriately impurity doped to form the drain of the FET 112a. Similarly, ends 116a and 118a of the fin 104a may form the source and drain of another FET 120a. The illustrated portion of IC 100a thus includes two FinFETs 112a and 120a having a common gate electrode. In another configuration, if source 110a and source 116a are electrically coupled together and drain 114a and drain 118a are electrically coupled together, the structure would be a two-fin FinFET having twice the gate width of either FinFET 112a or 120a. An insulating layer 122a, such as an oxide or nitride layer, provides electrical isolation between the fins 102a, 104a and between adjacent devices as is needed for the circuit being implemented.

The channel of the FinFET 112a extends along a sidewall 124a of the fin 102a beneath the gate electrode 108a, along the top 125a of the fin, as well as along an opposite sidewall of the fin 102a which is not visible in this perspective view. The advantage of the FinFET structure is that, although the fin 102a has only the narrow width represented by arrows 126a, the channel has a width represented by at least twice the height of the fin above the oxide 122a. In general, the channel width can be greater than the fin width.

In the example described with regard to FIG. 1a, the source and drain regions are formed within each of the fins 102a, 104a. The common gate electrode 108a overlying the fins 102a, 104a defines the channel region of the respective fins, while a continuous isolation layer 122a is provided in trenches which delineate and partially embed the fins, except for the portion of the fins over which the gate electrode 108a is formed, thereby adjusting an effective height of the fins.

FIG. 1b schematically illustrates a perspective view of another FinFET integrated circuit (IC) 100b corresponding to a three-dimensional transistor configuration or tri-gate transistor configuration. As illustrated, corresponding semiconductor fins 110b may be provided in an active region 101b in combination with a dielectric material 106b. An effective fin height is adjusted by the amount or height of the dielectric material 106b which is filled in between the semiconductor fins 110b.

For forming the IC 100b, a gate opening 120b is provided within a gate electrode structure formed above the active region 101b, wherein the gate electrode structure comprises a spacer structure 122b. Then, a masking pattern is formed within the gate opening in accordance with the fins 110b to be fabricated. After having formed the fins 110b, a gate electrode may be formed by depositing a gate dielectric layer on the exposed surface areas of the active region 101b in the gate opening 120b and, particularly, on exposed surfaces of the fins 110b. The gate opening 120b, as depicted in FIG. 1b, therefore represents the gate electrode, which is omitted for the sake of a clear perspective illustration of IC 100b in FIG. 1b.

In accordance with the spacer structure 122b, source regions 110bS and drain regions 110bD are formed in the active region 101b at respective ends of fins 110b. In the IC 100b depicted in FIG. 1b, the source regions 110bS and the drain regions 110bD are not constituted by the fins 110b and, in particular, the source and drain regions are not formed within the fins 110b.

FIG. 1b further depicts a contact layer 140b with a stress-inducing layer 141b for enhancing mobility properties of charge carriers within the channel regions and another dielectric layer 142b formed over the stress-inducing layer 141b.

Recently, FinFETs have been considered as representing important candidates for next generation transistors at 22 nm and beyond technologies. Opposed to conventional planar FET configurations, FinFETs allow for more effective suppression of "off-state" leakage currents because the channel is surrounded by several gates on the multiple surfaces of the fins. For this reason, multiple gate configurations are considered as to allow enhanced current in the "on" state of according transistors, also known as drive currents, such that power consumption of nonplanar FETs are expected to be further lowered and device performance to be further enhanced as compared to conventional planar FETs.

When considering FinFET technologies, further technological integration challenges arise. For example, it turns out that conformal deposition of particularly thin layers on the fins becomes more difficult to achieve on surfaces of current fins, particularly on vertical surfaces of the fins. Furthermore, it becomes more difficult to perform implantation processes for sufficiently adjusting required doping profiles in present fins because implanting into the vertical surfaces of scaled fins is intriguingly difficult to achieve. Therefore, the thicknesses of high-k material layers and metal gate layers deposited on the surfaces of fins, as well as required doping profiles within fins, cannot be sufficiently well controlled for modern scaled FinFET structures. Strong shifts in the threshold voltage and increased gate leakage arise, resulting in ICs which do not satisfy present quality requirements.

Therefore, it is desirable to provide methods for allowing a more stable and robust fabrication process when fabricating ICs having FinFET structures. It is further desirable to provide semiconductor devices satisfying present quality requirements, and particularly for FinFETs having less variability in their electrical device parameters. Particularly, it is desirable to provide methods and semiconductor device structures which enable better deposition coverage at thin layer deposition processes on fins and/or formation of a reliable dopant profile within fins.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides semiconductor device structures and methods for forming a semiconductor device. In various aspects of the present disclosure, one or more fins are provided, the one or more fins having a lower portion and an upper portion disposed on the lower portion. The lower portion is embedded into a first insulating material. Herein, the upper portion has at least one of a substantially triangular shape and a substantially rounded shape and a substantially trapezoidal shape. Furthermore, a layer of a second insulating material different from the first insulating material is formed on the upper portion.

In accordance with an embodiment, a method for forming a semiconductor device is provided, wherein the method includes forming a fin in a surface of a semiconductor substrate, the fin having a portion of at least one of a substantially triangular shape and a substantially rounded shape, and forming a layer of high-k material over the shaped portion of the fin.

In accordance with another embodiment, a method for forming a semiconductor device is provided, wherein the method includes forming a plurality of trenches in a surface of a semiconductor substrate, the trenches delineating one or more fins, filling the trenches with an insulating material and forming a gate structure overlying the trenches and the one or more fins traverse to a length direction of the trenches and the one or more fins, wherein the gate structure comprises one or more dummy gates and sidewall spacers adjacent to the one or more dummy gates. The method further includes removing the one or more dummy gates for forming one or more gate openings, removing the insulating material in the one or more gate openings for at least exposing portions of the one or more fins within the one or more gate openings and performing a shaping process to the exposed portions of the one or more fins within the one or more gate openings for forming the exposed portions to one of a substantially triangular shape and a substantially rounded shape and a substantially trapezoidal shape.

In accordance with another embodiment, a method for forming a semiconductor device is provided, wherein the method includes forming a first masking structure above a semiconductor layer, the first masking layer having a gate opening that defines a lateral size and position of a gate electrode, and forming a second masking structure in the gate opening, the second masking structure having a plurality of mask features defining a lateral size and position of a plurality of fins to be formed in the semiconductor layer. The method further includes performing an etching process using the first masking structure and the second masking structure to form the plurality of fins in a portion of the semiconductor layer and performing a shaping process to the exposed one or more fins within the one or more gate openings for forming the one or more fins to at least one of a substantially triangular shape and a substantially rounded shape and a substantially trapezoidal shape.

In accordance with another embodiment, a semiconductor device structure is provided, the semiconductor device structure including a semiconductor substrate and a fin formed in a surface of the semiconductor substrate, the fin being delineated by trenches formed at each side of the fin along its length dimension and exposing sidewall surfaces of the fin. Herein, each trench is partially filled with an insulating material defining a lower portion of the fin being embedded by the insulating material and an upper portion of the fin remaining uncovered by the insulating material, wherein the upper portion of the fin is at least one of a substantially triangular shape and a substantially rounded shape.

In accordance with another embodiment, a semiconductor device structure is provided. The semiconductor device structure includes a semiconductor substrate and a fin formed in a surface of the semiconductor substrate, the fin being delineated by trenches formed at each side of the fin along its length dimension and exposing sidewall surfaces of the fin. Each trench is partially filled with an insulating material defining a lower portion of the fin being embedded in the insulating material and an upper portion of the fin remaining uncovered by the insulating material, wherein the sidewall surfaces of the upper portion and the sidewall surfaces of the lower portion form a kink at each side with the sidewall surfaces of the upper portion being tapered in a substantially convergent manner.

BRIEF DESCRIPTION OF THE DRAWINGS

The disclosure may be understood by reference to the following description taken in conjunction with the accompanying drawings, in which like reference numerals identify like elements, and in which.

Figure 1A:
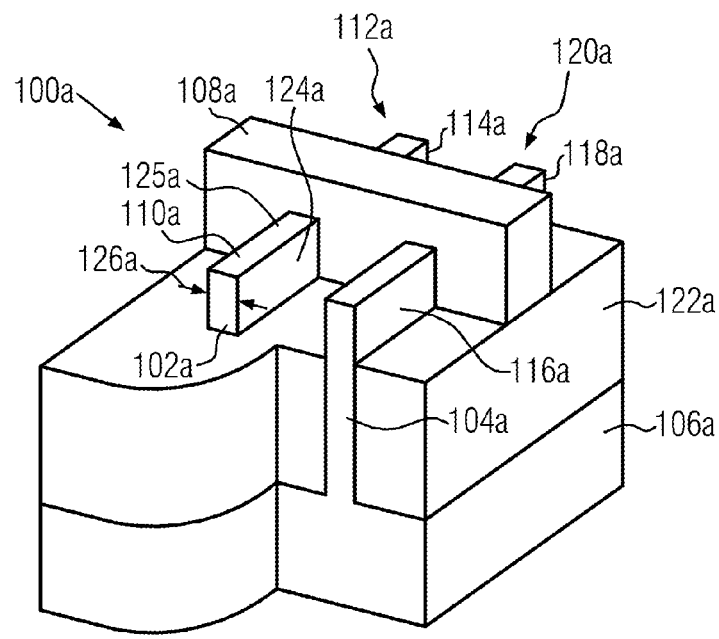
FIGS. 1a and 1b schematically illustrate conventional FinFETs in partially cut-away perspective views.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

The drawings showing embodiments of the present disclosure are semi-diagrammatic and are not to scale and, particularly, some of the dimensions are for clarity of presentation and are exaggerated shown in the figures. Similarly, although the views in the drawings generally show similar orientations for ease of description, this depiction in the figures is arbitrary for the most part. Generally, the embodiments of the disclosure can be operated in any orientation.

Multiple embodiments are disclosed and described having some features in common; for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provide any limitation for the present disclosure. Any numeration of embodiments and/or aspects, may it be explicit as $1^{st}$ embodiment and/or aspect, $2^{nd}$ embodiment and/or aspect, etc., or implied, is a matter of descriptive convenience and is not intended to provide any other significance or limitation for the present disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FinFETs may be formed on a bulk substrate, that is, the fin elements for accommodating the channel regions of the transistors may be formed within a semiconductor layer, wherein a height of the fins is substantially less than a thickness of the corresponding semiconductor layer. Thus, in this sense, any transistor configuration having additional semiconductor volume, such as silicon volume, provided below the actual fin elements may be considered as a bulk configuration, irrespective of whether any further buried insulating layer may be provided in the "depth" of the bulk semiconductor layer, such as an SOI (silicon-on-insulator) structure. After completing the basic structure for the fins and the bi- or tri-gate electrode structures in combination with the low resistance drain and source areas, which may be accomplished, in some illustrative embodiments, in a self-aligned manufacturing sequence, well-established process techniques may be used for adjusting the drain and source dopant profile, enhancing overall series resistance of the channel region, for instance by applying strain-inducing mechanisms and the like. Consequently, the advantages of a three-dimensional transistor configuration may be maintained while providing highly efficient overall manufacturing process flows.

In general, integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors used in the design of ICs can be either planar MOS transistors or FinFETs, with each type of device having certain unique advantages and disadvantages. Both types of MOS transistors can be fabricated as P-channel transistors and as N-channel transistors and both can be fabricated with or without mobility enhancing stress features. A circuit designer can mix and match device types, using P-channel and N-channel, planar MOS and FinFET, stressed and unstressed, to take advantage of the best characteristics of each device type as they best suit the circuit being designed.

Figure 1B:
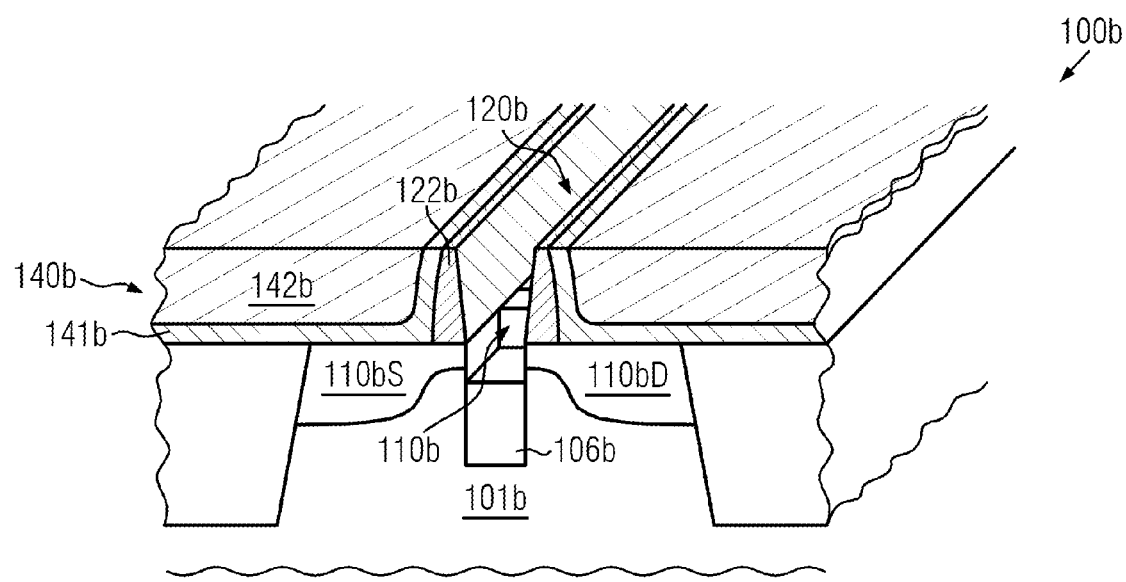

The present disclosure provides, in illustrative embodiments, FinFETs having alternative fin shapes which alleviate the problem of the prior art. According to some exemplary embodiments, FinFETs are realized having fins of a shape that differs from conventional rectangular fin shapes as shown in FIGS. 1a and 1b. The person skilled in the art appreciates that, in avoiding vertical surfaces, layers of high-k material and/or metal gate material overlying the fins may be deposited to a highly conformal degree. Furthermore, classical ion implantation processes may be applied to provide fins having a required doping profile along the fins without performing complicated implantation processes, such as plasma doping implantations or tilted implantations, for example, which may either not be productive or may be limited by shadowing effects for regions in between fins and which result in complex process flows in the fabrication of FinFET structures.

According to some illustrative embodiments of the present disclosure, FinFETs are provided with fins having rounded shapes. The person skilled in the art will appreciate that rounded fin shapes show good electrostatic behavior because leakage paths are suppressed due to avoiding high electrical fields at edges. Therefore, conformal electrical fields within the fins and good short channel control may be provided in according embodiments.

When describing the following figures, methods for forming an integrated circuit (IC) and/or integrated circuits (ICs) in accordance with various exemplary embodiments of the present disclosure will become apparent to the person skilled in the art. The described process steps, procedures and materials are to be considered only as possible examples of embodiments designed to illustrate to one of ordinary skill in the art concepts for practicing the invention. However, it is to be understood that the invention is not to be limited to these exemplary embodiments. Illustrated portions of ICs may include only a single FinFET and an optional planar MOS transistor, although those of skill in the art will recognize that an actual IC may include a large number of such transistors.

FinFETs as described with regard to illustrative embodiments may be to some extent similar to FinFETs 112a and 120a or 100b described above with regard to FIG. 1a or 1b. Initial steps as described below may relate specifically to the fabrication of P-channel transistors, but the person skilled in the art will appreciate that the processing steps may also be used to fabricate N-channel transistors alone or in combination with P-channel transistors. Various steps in the manufacture of ICs are well known and so, in the interest of brevity, many conventional steps will only be mentioned briefly herein or will be omitted entirely without providing the well-known process details.

In the following description, semiconductor device structures and methods for forming a semiconductor device are provided and, in particular, semiconductor device structures having one or more shaped fins and methods for forming a semiconductor device comprising shaping one or more fins are described.

Figure 2A:
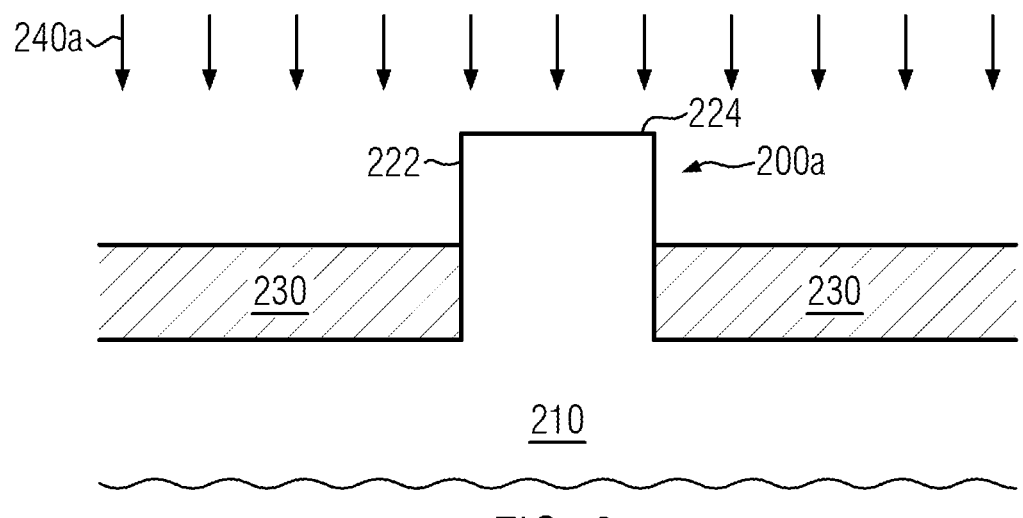
FIGS. 2a-2h schematically illustrate various processes according to alternative embodiments for shaping fins.
Figure 2B:
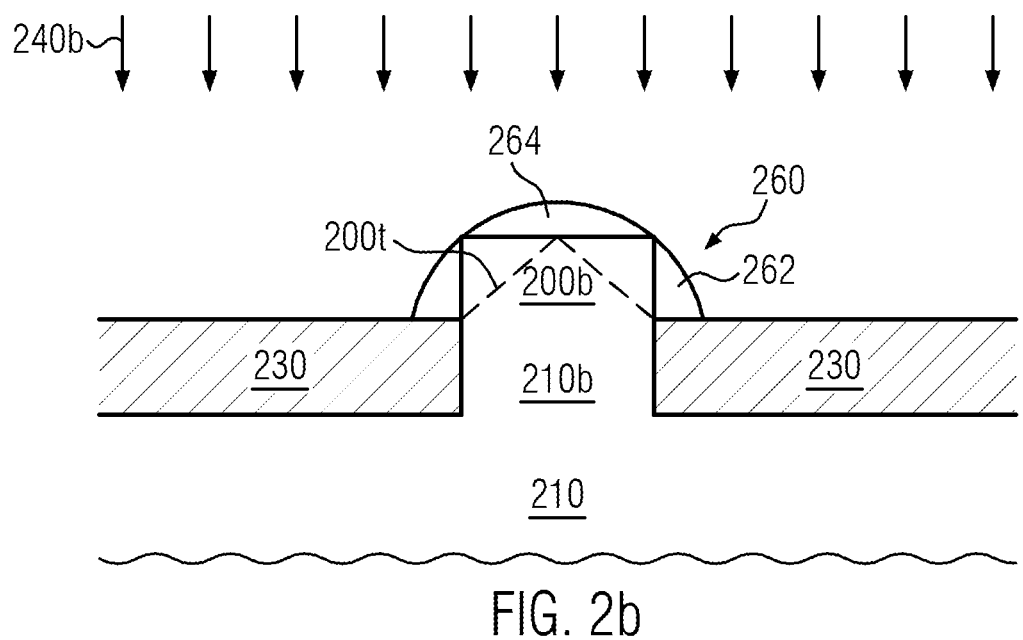

With regard to FIGS. 2a and 2b, a shaping process in accordance with a first embodiment will be schematically described. FIG. 2a illustrates, in a cross-sectional view, a fin 200a formed in a portion of a semiconductor substrate 210. The fin 200a as illustrated in FIG. 2a comprises sidewall surfaces 222 and a planar upper surface 224. According to the illustrative embodiment depicted in FIG. 2a, the fin 200a may be of a substantially rectangular shape in cross-sectional view. However, according to alternative embodiments, the fin 200a may be of a trapezoidal shape, i.e., the sidewall surfaces 222 are not in parallel to a normal direction of the surface of the semiconductor substrate 210.

Regions of an insulating material 230 are formed at both sides of the fin 200a such that the sidewall surfaces 222 are partially covered by the insulating material 230. According to some illustrative examples herein, the regions of insulating material 230 may represent shallow trench isolation (STI) regions which are formed adjacent to the fin 200a and delineate the fin 200a in the surface of the semiconductor substrate 210. The person skilled in the art will appreciate that a height of uncovered portions of the sidewalls 222 is adjusted by a height or amount of insulating material 230 formed at each side of the fin. Therefore, the fin 200a as depicted in FIG. 2a may be understood to have a lower portion which is embedded by the regions of insulating material 230 formed at both sides of the fin 200a, and may, therefore, also be referred to as a covered portion, and an upper or exposed portion which is represented by a portion of the fin projecting away from the regions of insulating material 230 and not being covered by the regions of insulating material 230.

According to some special illustrative examples, the fin 200a may be fabricated by patterning the surface of the semiconductor substrate 210, for example, by forming a masking pattern of a photoresist (not illustrated) on the surface of the semiconductor substrate 210 and subsequently performing an etching process for etching trenches (not illustrated) into the surface of the semiconductor substrate 210, wherein the trenches delineate one or more fins formed in the surface of the semiconductor substrate 210. Thereafter, an effective fin height may be adjusted by forming the insulating material 230 in the trenches (not illustrated) at each side of the fin 200a such that the trenches (not illustrated) are partially filled with the insulating material 230. However, this does not pose any limitation on the present disclosure and the person skilled in the art will appreciate that alternative ways for fabricating fins in the surface of the semiconductor substrate 210 may be applied.

The person skilled in the art will appreciate that fins having a trapezoidal shape instead of fins having a rectangular shape may be obtained by performing an anisotropic etching process when forming the fin 200a in FIG. 2a in accordance with some illustrative embodiments. Herein, a particular orientation of the semiconductor substrate 210 may be chosen such that crystal planes of greater density may be oriented in parallel to inclined sidewall surfaces of a trapezoidal fin to be formed. According to an explicitly disclosed illustrative example herein, the sidewall surfaces of the fin may be substantially aligned with the (110) crystal plane or the (100) crystal plane of the semiconductor substrate 210. A wet etch chemistry may be used as an etching process for etching trenches in the surface of the semiconductor substrate 210. The less dense crystal planes, such as planes (100) and (110), are more strongly etched than the more dense crystal planes, such as (111) crystal planes. If the chemical strength of the etch chemistry of the etching process 240 is chosen such that, for example, the (111) crystal plane is substantially not etched, the anisotropic etching process substantially stops on the first total intact or contiguous (111) crystal plane. In this way, the formation of trapezoidal fins is substantially self-limiting. The person skilled in the art will appreciate that accordingly formed fins may have inclined sidewall surfaces with regard to the sidewall surfaces 222 as shown in FIG. 2a.

Next, as shown in FIG. 2a, a shaping process 240a may be applied to the fin 200a. The person skilled in the art will appreciate that the shaping process 240a may be performed in order to achieve further shaping of the fin 200a. Due to the insulating material 230 formed at each side of the fin 200a, the shaping process 240a acts on the uncovered portion of the sidewalls 222 and the upper surface 224 of the fin 200a. Particularly, the shaping process 240a substantially acts on an exposed portion of the fin 200a projecting away from the insulating material 230. According to an illustrative example herein, the shaping process 240a may comprise an etching process having etching components acting along a direction normal to the surface of the semiconductor substrate 210 and along a direction perpendicular to the normal direction of the semiconductor substrate 210. Reactive ion etching (RIE) processes or plasma etch processes may be considered as exemplary etching processes without posing any limitation on the present disclosure. Various illustrative examples of the shaping process 240a will be described in more detail below.

A first example of the shaping process 240a of FIG. 2a will be described with regard to FIG. 2b which illustrates the fin 200a of FIG. 2a at different phases during the shaping process 240a of FIG. 2a in accordance with the first example. A lower portion 210b is covered by the regions of insulating material 230 as explained above with regard to FIG. 2a and an upper portion 200b is covered by a spacer structure 260. The spacer structure 260 comprises one or more sidewall spacers 262 and a capping layer 264 formed on an upper surface of the exposed portion 200b. The person skilled in the art will appreciate that the capping layer 264 may actually represent one or more layers formed on the upper surface of the upper portion 200b. The spacer structure 260 may be formed of a material or combination of materials comprising at least one of an oxide, such as silicon oxide and the like, and a nitride, such as silicon nitride and the like. This does not pose any limitation on the present disclosure and the person skilled in the art will appreciate that the spacer structure 260 may alternatively comprise the one or more sidewall spacers 262, and the capping layer 264 may be omitted.

An etching process 240b may be applied to the upper portion 200b and the spacer structure 260. The person skilled in the art will appreciate that a shaping of the upper portion 200b may be obtained in dependence on the etching resistance of the spacer structure 260, the etching resistance of the material of the upper portion 200b, particularly of the semiconductor substrate 210, and a geometry of the spacer structure 260. According to an illustrative example herein, a triangularly shaped fin structure may be obtained, which is indicated in FIG. 2b by broken line 200t. The person skilled in the art will appreciate that a height of the shaped fin structure 200t with regard to the unshaped upper portion 200b may be substantially maintained in embodiments using a capping structure 264.

Figure 2C:
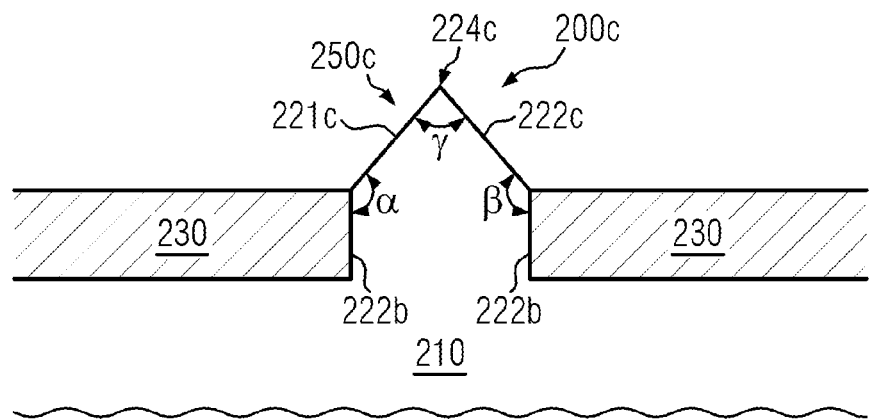

FIG. 2c schematically illustrates a triangularly shaped fin 200c according to various embodiments of the present disclosure. In the triangularly shaped fin 200c, an upper surface (e.g., 224 in FIG. 2a) is substantially decreased to a line which is represented by a tip 224c in FIG. 2c. The person skilled in the art will appreciate that the tip 224c of the fin 200c may represent an intersection line at which oblique sidewall surfaces 221c and 222c intersect to form intersection angle gamma (γ). The oblique sidewall surfaces 221c and 222c represent remaining portions of sidewall surfaces of an originally rectangular or, generally, trapezoidal fin and form an upper portion 250c of the fin 200c which is not covered by regions of insulating material 230.

As a result of a shaping process, the oblique sidewall surfaces 221c, 222c form angles alpha (α) and beta (β) with regard to sidewall portions 222b which are covered by the insulating material 230. The angles α and β represent kinks in the sidewall surfaces of the fin 200c at the level of the regions of insulating material 230 such that a kink is formed in the sidewall surfaces at each side of the fin 200c at a height corresponding to a height of the covered sidewalls 222b. The person skilled in the art will appreciate that the angles α, β and γ may relate to the aspect ratio of an upper portion of an unshaped fin, i.e., the ratio of the effective fin height to its width, and that the angles α and β may be substantially equal or unequal.

According to some explicitly-disclosed illustrative embodiments, the intersection angle γ formed by the oblique sidewall surfaces 221c and 222c may be substantially smaller than about 90 degrees. According to some special illustrative examples herein, the intersection angle γ may be in a range between about 20-80 degrees. According to some preferred examples, the intersection angle γ may be in a range between about 40-80 degrees, and more preferably in a range between 40-60 degrees. This does not pose any limitation on the present disclosure and the person skilled in the art will appreciate that, according to illustrative embodiments of the present disclosure, the angles α and β may be in a range from about 140-160 degrees.

The person skilled in the art will appreciate that the above-disclosed illustrative embodiments do not pose any limitation to the present disclosure. The person skilled in the art will appreciate that the intersection angle γ may be adjusted in choosing appropriate etching parameters for the etching process 240b in FIG. 2b, for example. Additionally or alternatively, the aspect ratio of unshaped fins may be adjusted in dependence on a desired geometry of shaped fins. Therefore, explicitly disclosed values are merely illustrative and other values may be taken into account without departing from the scope of the present disclosure.

Figure 2D:
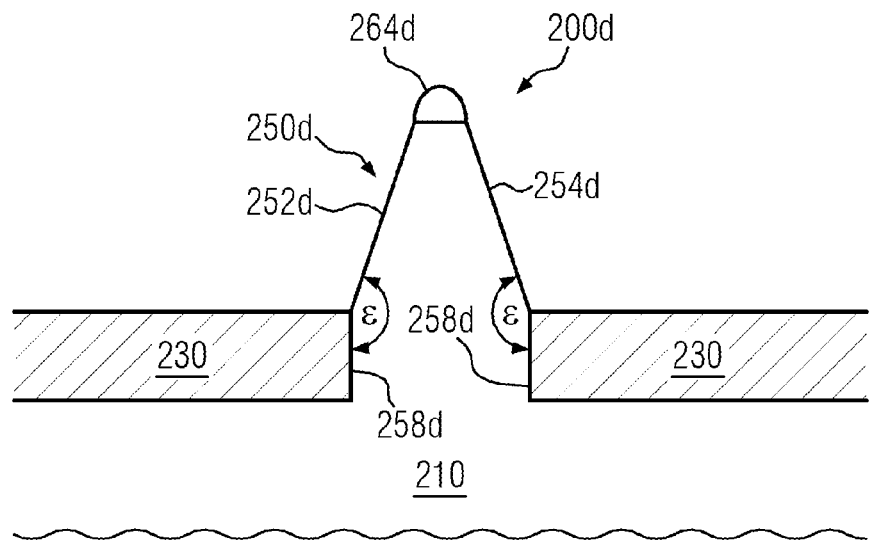

FIG. 2d illustrates another substantially triangularly-shaped fin 200d which may be obtained in some illustrative embodiments of the present disclosure. The fin 200d has a substantially rounded portion 264d and a substantially conical portion 250d with oblique sidewall surfaces 252d, 254d. The oblique sidewall surfaces 252d and 254d represent remaining portions of sidewall surfaces of an originally rectangular or, generally, trapezoidal fin and the conical portion 250d of the fin 200d may substantially correspond to an upper portion of an unshaped fin, such as fin 200a in FIG. 2a. Due to shaping, the oblique sidewall surfaces 252d, 254d form angles $\in$ with regard to sidewall portions 258d which are covered by the insulating material 230 and therefore were not exposed to a shaping process. The person skilled in the art will appreciate that, in some illustrative embodiments, the angles $\in$ may be different in size as opposed to the symmetric embodiment shown in FIG. 2e. In general, the angles defining the conical portion 250d may be related to an aspect ratio of the fin 200d and/or the corresponding unshaped fin before a shaping process has been applied (not illustrated). The angles $\in$ represent kinks in the sidewall surfaces of the fin 200d at the level of the regions of insulating material 230 such that a kink is formed at each side of the fin 200d at a height corresponding to a height of the covered sidewalls 258d, whether the angles $\in$ may be substantially equal or unequal. In accordance with some illustrative examples, the angles $\in$ may be in a range from about 140-175 degrees and preferably in a range between about 140-170 degrees, and more preferably in a range between about 140-160 degrees.

According to an illustrative embodiment, the rounded portion 264d may be obtained by exposing a triangularly or trapezoidal shaped fin to a further rounding process for substantially rounding corners and edges. According to some illustrative examples, the rounding process comprises an isotropic etching process.

According to another illustrative embodiment, the rounded portion 264d may be obtained when applying a shaping process to the upper portion 200b as described above with regard to FIG. 2b, the upper portion 200b having a capping structure 264 formed thereon. The person skilled in the art will appreciate that, when appropriately selecting material(s) and thickness(es) for the capping structure 264, a rounded portion of the capping structure (e.g., 264d in FIG. 2d) may remain. The rounded portion 264d may, therefore, maintain a portion of an upper surface of the unshaped fin which is covered by the rounded portion 264d in FIG. 2d.

Figure 2E:
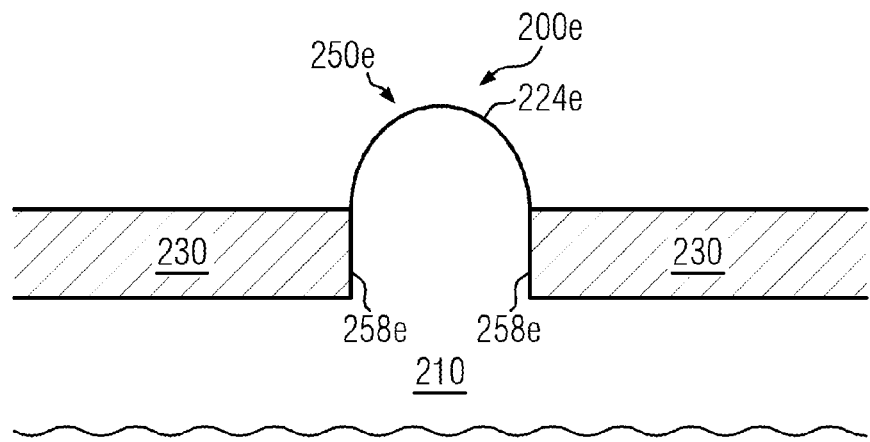

A second example of a shaping process will be described with regard to FIG. 2e which shows a rounded fin structure 200e having an upper portion 250e and a lower portion defined by sidewall surfaces 258e covered by regions of insulating material 230. The lower portion, as delineated by the covered sidewall surfaces 258e, is embedded by the regions of insulating material 230. The upper portion 250e of the rounded fin structure 200e has a rounded upper surface 224e. Although FIG. 2e illustrates an embodiment having a rounded surface 224e of a substantially rounded shape, the person skilled in the art appreciates that substantially elliptical or, in general, other asymmetrically rounded surfaces 224e may be possible. The person skilled in the art will appreciate that rounded surfaces may be obtained from applying several shaping processes to a rectangular or trapezoidal fin so as to fabricate facetted sidewall surfaces and subsequently applying one or more rounding processes for rounding edges of the faceted sidewall surfaces. It is also possible to obtain a rounded portion by applying a rounding process to a substantially rectangular or trapezoidal fin structure. However, other processes may be used as the person skilled in the art is aware.

Figure 2F:

By means of FIGS. 2f-2h, a second embodiment of the present disclosure for forming shaped fins will be described. FIG. 2f illustrates a semiconductor substrate 210, such as a bulk substrate. Alternatively, the semiconductor substrate 210 may represent a semiconductor layer on a buried insulating layer, such as in SOI (silicon-on-insulator) applications. A surface of the semiconductor substrate 210 is patterned by forming a masking pattern 270 on the surface of the semiconductor substrate 210. The masking pattern 270 may be, for example, formed by depositing and patterning a layer of a photoresist in accordance with known patterning methods, such as photolithography methods and the like. The person skilled in the art will appreciate that a width of the masking pattern 270 corresponds to a width of fins to be fabricated in the surface of the semiconductor substrate 210.

Figure 2G:
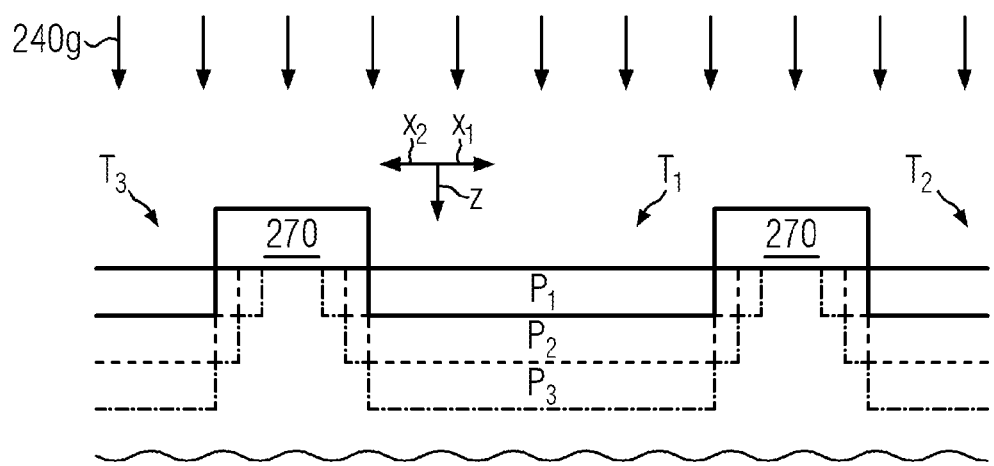

Next, an etching process 240g is performed as illustrated in FIG. 2g. The etching process 240g has an etching component acting along a direction indicated by an arrow z which substantially represents a direction normal to the surface of the semiconductor substrate 210. Furthermore, the etching process has a lateral etching component acting along a direction perpendicular to the direction z, which is indicated by arrows $x_1$ and $x_2$ in FIG. 2g. In the following description, the respective etching components will be referred to by the respective numerals of the respective directions: z will be understood to denote the etching component along the direction z and the lateral etching component will be denoted by $x_1/x_2$.

The etching component z of the etching process 240g etches trenches $T_1, T_2, T_3$ into the surface of the semiconductor substrate 210 in alignment with the masking pattern 270. In dependence on the time during which the etching component z acts on the semiconductor substrate 210, a depth of the trenches $T_1, T_2, T_3$ is increased. FIG. 2g illustrates three phases $P_1, P_2, P_3$ during the etching process 240g, the three phases corresponding to the etching process 240g at three etching times t1, t2, t3 with t1<t2<t3, during which the etching process is applied. Phase $P_1$ represents a moment during the etching process 240g after a time t1 has lapsed since the etching process 240g was initiated. Phase $P_2$ represents a moment during the etching process 240g after a time t2 has lapsed since the etching process 240g was initiated. Phase $P_3$ represents a moment during the etching process 240g after a time t3 has lapsed since the etching process 240g was initiated. FIG. 2g shows that the depth of the trenches $T_1, T_2, T_3$ increases with advancing etching time. In the phase $P_1$, the trenches are formed as schematically indicated by a solid line in FIG. 2g, the trench in the phase $P_1$ having a ground surface and sidewall surfaces aligned with regard to the masking pattern 270. In phase $P_2$, the depth of the trenches $T_1, T_2, T_3$ is increased as the etching component z acts on the ground surface of the trenches for a time t2-t1. In addition, as during the phase $P_1$, sidewall surfaces of the trenches are formed, surfaces of substrate material are exposed on which the etching component $x_1/x_2$ may act such that the trenches $T_1, T_2, T_3$ are increased in their lateral dimensions, as indicated by the broken lines in FIG. 2g, because the etching component $x_1/x_2$ acts during a time t2-t1 on the sidewall surfaces of the trenches $T_1, T_2, T_3$ which are exposed in phase $P_1$ (indicated by solid lines). Accordingly, in phase $P_3$, the lateral etching component $x_1/x_2$ is acting on the sidewall surfaces of the trenches $T_1, T_2, T_3$ which are formed in phase $P_2$ (broken lines in FIG. 2g) for a time t3-t2, while the etching component z acts on the ground surfaces of the trenches to further increase the depth of the trenches $T_1, T_2, T_3$ such that the trenches $T_1, T_2, T_3$ are increased in dimensions along the directions indicated by arrows $x_1$ and $x_2$ and in the dimension along the direction indicated by arrow z resulting in the increased trenches as indicated by the broken and dotted line in FIG. 2h. It is apparent from the discussion of the etching process 240g in FIG. 2g that the lateral etching component results in a continued undercutting of the masking pattern 270 with progressing etching time.

Although FIG. 2g illustrates three discrete phases $P_1, P_2$ and $P_3$ at discrete times t1, t2, t3, the person skilled in the art understands that this is for the purpose of illustration only and that actual shapes of etched trenches in dependence on progressing etching time may be approximated by taking time intervals t1, t2, t3, ..., ti, t(i+1) with t2-t1, t3-t2, ..., t(i+1)-ti becoming very small and approaching zero, wherein i represents a natural number. In this sense, the trenches $T_1, T_2, T_3$ are only schematically illustrated by solid lines, broken lines and broken and dotted lines during the respective discrete phases and no limitation of the present disclosure is intended by FIG. 2g.
]
The person skilled in the art appreciates that the etching process 240g as described with regard to FIG. 2g results in fins having one of a substantially trapezoidal shape and a substantially triangular shape. The etching rates of the etching components z and $x_1/x_2$ relate to the geometry of the fins to be manufactured and may be adjusted to obtain the desired target fin geometry. On the other hand, the geometry of the fins to be manufactured relates to details of the masking pattern 270, such as size and distance and the like. Therefore, the person skilled in the art will appreciate that the geometry of the fins to be manufactured relates to the etching components and $x_1/x_2$ of the etching process 240g and the geometry of the masking pattern 270.

Figure 2H:

FIG. 2h illustrates schematically an illustrative example of a fin structure 200h after the etching process 240g in FIG. 2g is terminated and the masking pattern 270 is removed. The fin structure 200h comprises fins 202 of a triangular shape formed in the surface of the semiconductor substrate 210. This does not pose any limitation on the present disclosure and the person skilled in the art will appreciate that fins of a substantially trapezoidal shape may be obtained instead. According to alternative illustrative examples, fin structures having fins such as fin 200d in FIG. 2d may be obtained.

Figure 3A:
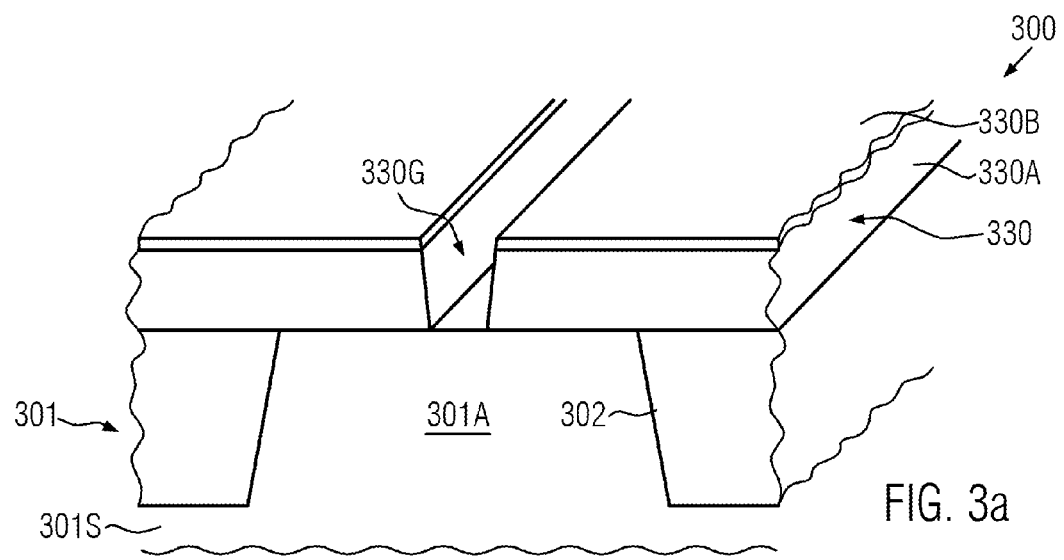
FIGS. 3a-3e schematically illustrate a process flow for fabricating FinFETs according to illustrative embodiments of the present disclosure.

With regard to FIGS. 3a-3e, an exemplary illustrative embodiment of a process flow for fabricating a FinFET in accordance with an illustrative embodiment of the present disclosure will be explained. FIG. 3a schematically illustrates a perspective view of a semiconductor device structure 300 in a process flow for fabricating a FinFET similar to the FinFET shown in FIG. 1a. The semiconductor device structure 300 comprises a substrate 301 which may be any appropriate carrier material having formed thereon a crystalline semiconductor material, such as a silicon material, whose thickness is greater than a depth of any well region of transistors to be formed in and above the substrate 301. Therefore, the device 300 may be considered as a bulk configuration, even if any insulating material may be provided in the "depth" of the substrate 301, as long as a crystalline portion 301S of the substrate 301 may have a sufficient thickness so as to allow the formation of bulk transistors. A dielectric material 302 is provided to form an isolation structure by, for example, using well-established STI processes, such as lithography, etch, deposition, planarization-based techniques and the like. Therefore, an active region 301A may be provided in the semiconductor substrate 301, the active region 301A being delineated by the dielectric material 302 in lateral directions.

A masking layer 330 may be formed on a surface of the semiconductor substrate 301, for instance, by depositing a sub-layer 330A using well-established chemical vapor deposition (CVD) techniques and, if required, forming an optional stop layer 330B by depositing a silicon material and forming a platinum material on the sub-layer 330A. A platinum silicide material may be formed by performing a heat treatment to fabricate the stop layer 330B. It should be appreciated that any other material composition for the layer 330 and any of the layers 330A and 330B may be used as long as the desired etch stop and CMP stop capabilities may be achieved. In other cases, the stop capabilities of the layer 330A may be considered appropriate for the further processing and the layer 330B may be omitted.

In the illustrative embodiment shown in FIG. 3a, a gate opening 330G is then formed above the active region 301A, exposing a surface portion of the active region 301A. According to some illustrative examples herein, the gate opening 330G may be formed by appropriate patterning techniques, such as photolithography techniques, etching techniques and the like, as it is known in the art.

Figure 3B:
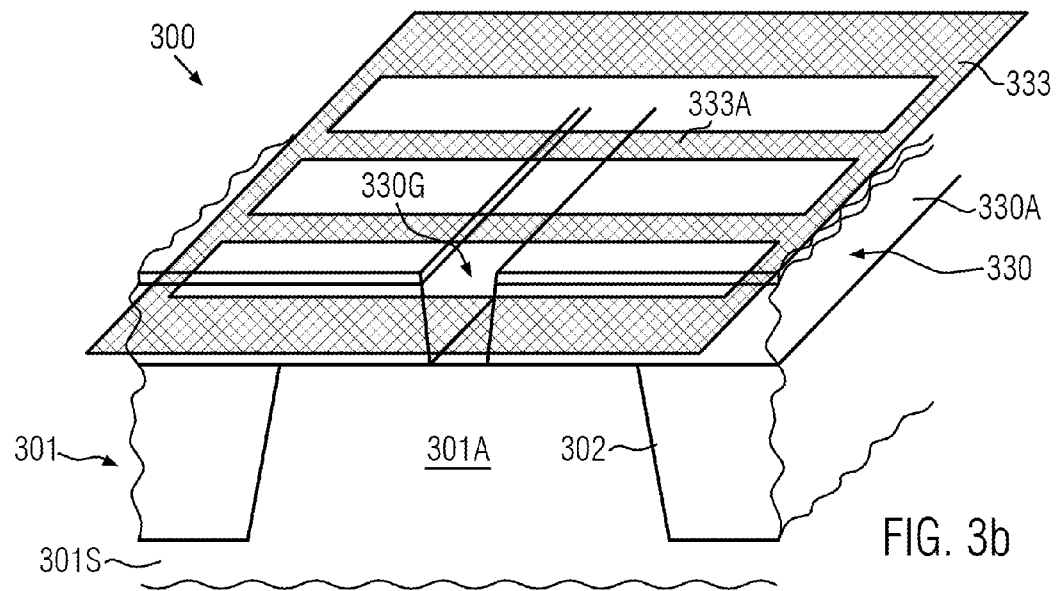

FIG. 3b schematically illustrates a perspective view of the semiconductor device structure 300 in a further advanced phase during the illustrative process flow according to an illustrative embodiment of the present disclosure. As illustrated, a further mask layer 333, for instance in the form of a silicon dioxide material, may be formed above the masking layer 330 and within the gate opening 330G, wherein a plurality of mask features 333A may be provided, for instance in the form of lines, which may substantially define the lateral position and size of semiconductor fins to be formed in the active region 301A in a self-aligned manner with respect to the gate opening 330G. This does not pose any limitation on the present disclosure, and the person skilled in the art will appreciate that the further mask layer 333 may be alternatively provided in the form of a sub-layer of the masking layer 330, for instance in the form of a silicon dioxide layer, which may be used as an etch stop material upon forming the gate opening 330G and which may be subsequently patterned so as to form the mask features 333A within the gate opening 330G.

Figure 3C:
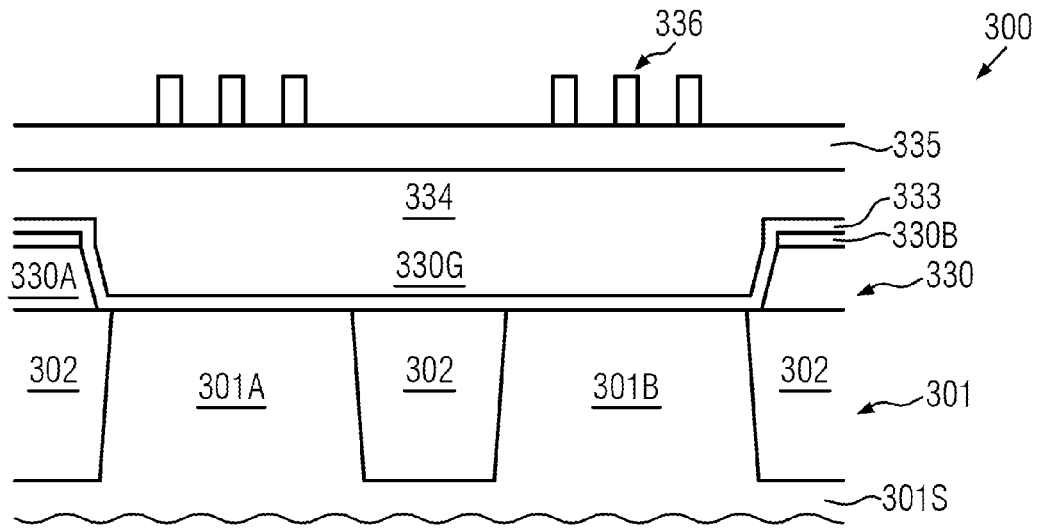

FIG. 3c schematically illustrates a cross-sectional view of the semiconductor device structure 300 as illustrated in FIG. 3b during a phase in the process flow prior to patterning the further mask layer 333, the cross-section being taken along a lengthwise extending direction of the gate opening 330G in FIG. 3b. According to the special illustrative embodiment depicted in FIG. 3c, an optical planarization layer 334 in combination with an ARC layer 335 may be provided so as to form a resist mask 336 which may be used for patterning the mask layer 333.

The person skilled in the art will appreciate that the semiconductor device structure 300 as illustrated in FIG. 3c, for example, may be formed on the basis of the following processes. The mask layer 333 may be formed above the masking layer 330 on the basis of appropriate deposition techniques, such as CVD of silicon dioxide material, while, in other embodiments, the layer 333 may be provided as part of the masking layer 330 and may thus be exposed within the gate opening 330G upon patterning the layers 330B and 330A of the masking layer 330. Thereafter, the sacrificial materials 334 and 335 may be provided on the basis of well-established process techniques, followed by the application of a resist material and patterning the same in order to obtain the resist mask 336. It should be appreciated that forming an opening in the bottom of a trench may frequently be applied, for instance, in forming complex metallization systems on the basis of a dual damascene process strategy. Consequently, any such well-established process recipes may be used and appropriately modified in order to pattern the mask layer 333 at the bottom of the gate opening 330G. Consequently, upon applying well-established process strategies, the mask layer 333 may be patterned, thereby exposing corresponding areas in the active regions 301A, 301B, which may represent respective "spacers" between semiconductor fins. For example, the corresponding spacers may be considered as "vias" in a process sequence that may correspond to a trench first/via last approach, which may frequently be applied in forming metal lines and vias in complex metallization systems.

Figure 3D:
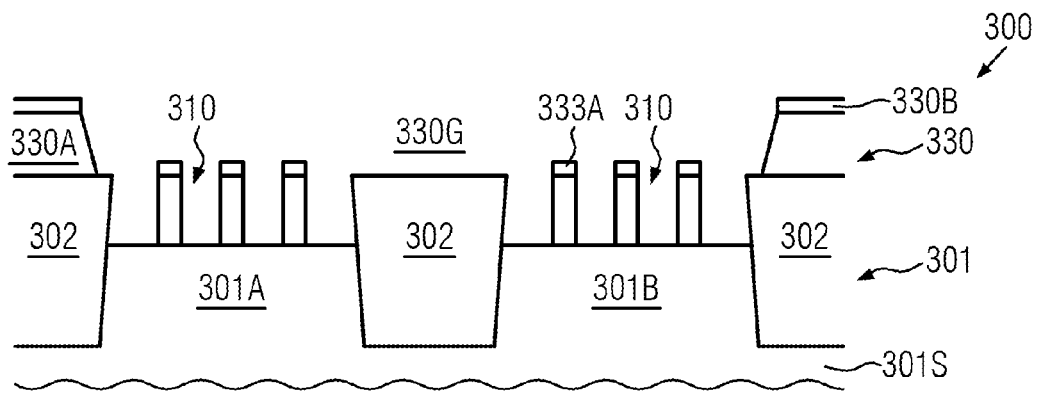

FIG. 3d schematically illustrates the semiconductor device structure 300 in a further advanced phase during the process flow according to an illustrative embodiment of the present disclosure. As depicted in FIG. 3d, an appropriate etch process may be performed, for instance on the basis of HBr-based etch recipes, in order to form corresponding fins 310 in accordance with the mask layer 333 (FIG. 3c). The person skilled in the art will appreciate that the lateral size and position of the fins 310 may be defined in accordance with the mask features 333A. According to an illustrative example herein, the height of the semiconductor fins 310 may be determined on the basis of a time-controlled etch process, while, in other cases, appropriate species may be incorporated into the active regions 301A, 301B, for instance on the basis of ion implantation and the like. The implantation species may be used as an appropriate etch control or etch stop material. It should be appreciated that appropriate etch recipes may be established on the basis of etch techniques, which are also frequently used in sophisticated planar transistor configurations, for instance by forming cavities in the active region of the planar transistor in order to incorporate a strain-inducing semiconductor material as is known in the art.

Figure 3E:
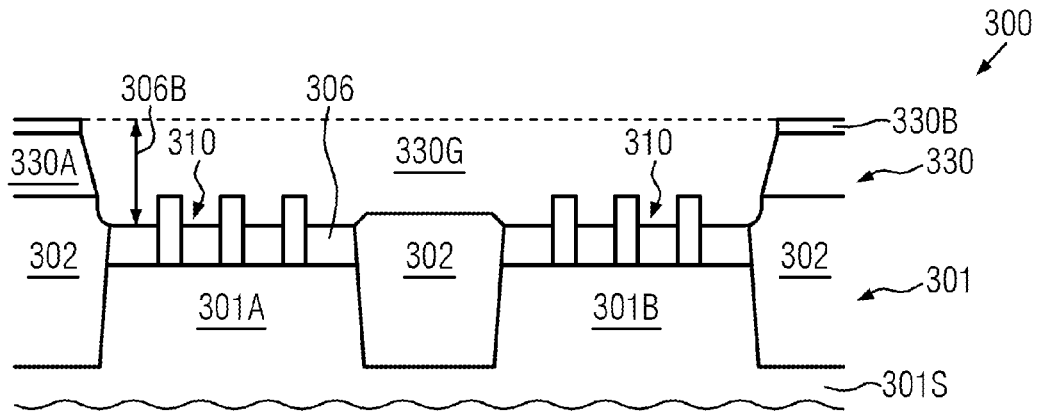

FIG. 3e schematically illustrates the semiconductor device structure 300 in a further advanced phase during the process flow according to an illustrative embodiment of the present disclosure. A dielectric material 306 may be used to fill in spaces between the fins 310 so as to adjust an effective height of the fins 310. For example, the dielectric material 306 may be filled to at least a level as indicated by the broken line in FIG. 3e and subsequently be removed, for instance on the basis of diluted HF acid or atomic layer process recipes, which allows for adjusting a desired height level of the dielectric material 306, as indicated by the double-sided arrow 306B. The person skilled in the art will appreciate that, in this way, the final height level of the material 306 may be adjusted with high precision and uniformity after removal of the portion as indicated with the arrow 306B. Therefore, the height level of the semiconductor fins 310 may be provided with a low degree of variability, so that the electrically effective height of the semiconductor fins 310 may be achieved with superior control and uniformity, since the semiconductor fins 310 may also be patterned on the basis of well-established uniform etch techniques which are typically used for patterning sophisticated gate electrode structures.

According to the illustrative embodiment depicted in FIG. 3e, the removal of the excess portion indicated by arrow 306B may also affect exposed portions of the shallow trench isolation 302, wherein, generally, a corresponding material removal in exposed portions of the structures 302 may be reduced, for instance, providing an appropriate etch stop material, such as silicon nitride material, while in other cases, upon forming the isolation structure 302, a corresponding treatment may be performed so as to incorporate nitrogen species and the like, thereby reducing the etch rate compared to the dielectric material 306.

Having provided the semiconductor device structure 300 as depicted in FIG. 3e, the person skilled in the art will appreciate that further shaping of the semiconductor fins 310 may be performed in accordance with the present disclosure, such as discussed above with regard to illustrative embodiments described with regard to FIGS. 2a-2h, the disclosure of which is incorporated by reference in its totality. It is noted that, with regard to fin shaping in accordance with FIGS. 2f-2h, an accordingly modified etching process is performed subsequent to the process as described with regard to FIG. 3c above, forming shaped fins at the stage illustrated in FIG. 3d.

With regard to FIGS. 4a-4g, another illustrative embodiment of the present disclosure for fabricating FinFET structures will be described.

Figure 4A:
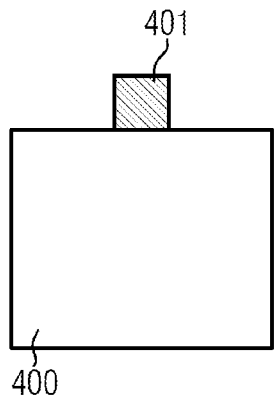
FIGS. 4a-4g schematically illustrate other process flows for fabricating FinFETs according to illustrative embodiments of the present disclosure.

FIG. 4a schematically shows a cross-sectional view of a portion of a semiconductor substrate 400. The semiconductor substrate may be similar to the semiconductor substrate 301 as described above with regard to FIGS. 3a-3e. A masking pattern 401 for covering an area on the semiconductor substrate 400, which is to be a fin active region, is formed. According to some exemplary embodiments, silicon nitride may be used as a masking pattern material. However, other appropriate mask forming materials may be considered instead for forming the masking pattern 401 as the person skilled in the art will appreciate. The masking pattern 401 may represent a hardmask in some illustrative examples.

Figure 4B:
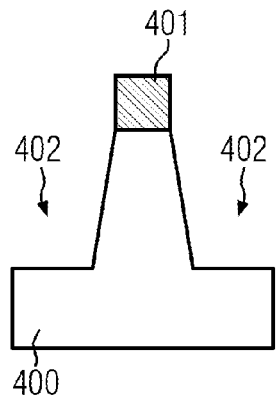

Next, as shown in FIG. 4b, the semiconductor substrate 400 may be etched using the masking pattern 401 to form trenches 402. The semiconductor substrate 400 may be etched vertically, but, as illustrated in FIG. 4b, also in a non-vertical manner, so as to provide a predetermined taper. As shown in FIG. 4b, the cross-section of the etched semiconductor substrate 400 may, for example, assume the form of a trapezoidal shape. The person skilled in the art will appreciate that this does not pose any limitation to the present invention and, alternatively, a substantially triangular fin (not illustrated) may be formed as illustrated in FIG. 2h above.

Figure 4C:
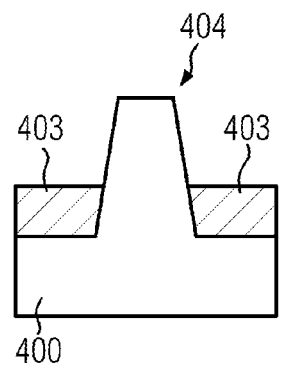

FIG. 4c schematically illustrates the etched semiconductor substrate 400 during a later phase in the process flow according to an illustrative embodiment. A semiconductor fin 404 is provided. At both sides of the semiconductor fin 404, the trench (402 in FIG. 4b) is filled by an isolating material in order to provide STI regions 403 at each side of the fin 404 by filling the isolating material into the trench at each side of the fin 404 so as to adjust an effective height of the fin 404. The person skilled in the art will appreciate that the fin 404 has an exposed upper surface and, according to the effective height, portions of the sidewall surfaces remain uncovered.

Figure 4D:
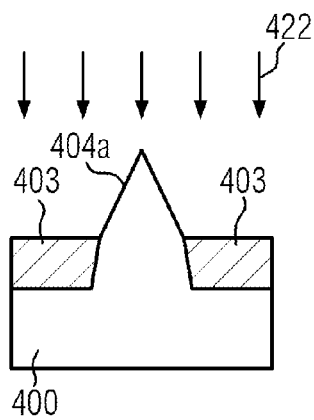

Next, a shaping process 422 may be applied to the semiconductor fin as depicted in FIG. 4d. In the shaping process 422, the exposed portion of the semiconductor fin 404 as shown in FIG. 4c is shaped. The person skilled in the art will appreciate that, according to an explicit illustrative embodiment, the shaping process 422 may be performed in accordance with embodiments as described above with regard to FIGS. 2a-2h. As a result, a substantially triangularly-shaped fin 404a may be obtained as depicted in FIG. 4d. It is noted that the masking layer 401 (FIG. 4b) may still be disposed on the fin 404 before applying the shaping process, although omitted in the schematic illustration of FIG. 4c. Alternatively, a capping layer (not illustrated) may be deposited on the fin 404 in FIG. 4c before performing a shaping process for forming a shaped fin.

Figure 4E:
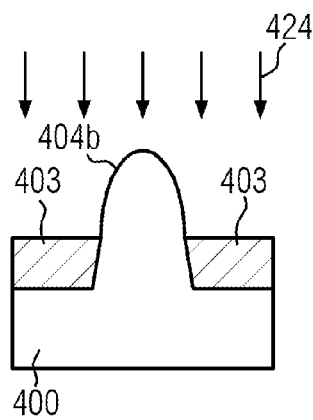

Alternatively to the above-described shaping process 422 as depicted in FIG. 4d, a shaping process 424 may be instead applied. The person skilled in the art will appreciate that the shaping process 424 may be performed in accordance with illustrative embodiments as described with regard to FIGS. 2a-2h above. As a result, a rounded fin shape configuration 404b may be obtained as depicted in FIG. 4e.

Figure 4F:
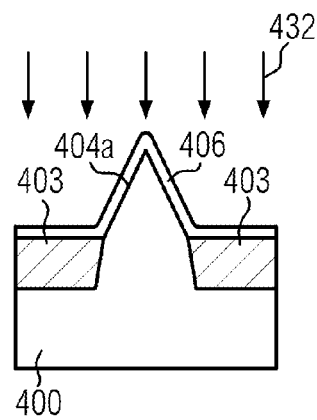

As shown in FIG. 4f, subsequent to the shaping process 422 as described above with regard to FIG. 4d, a deposition process 432 may be performed in order to deposit a layer 406 overlying the triangularly-shaped fin 404a. The layer 406 may be at least one of a high-k material or a metal gate. The person skilled in the art will appreciate that the layer 406 may be deposited with a highly conformal thickness across the fin 404a as discussed above. Alternatively, or additionally, an implantation process (not illustrated) may be performed in order to form a desired doping profile within the fin 404a.

Figure 4G:
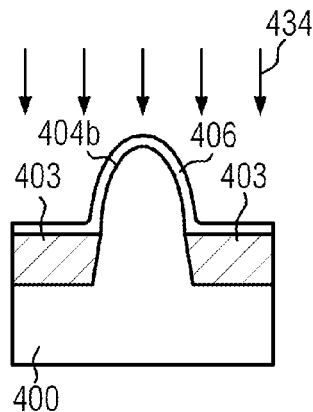

As shown in FIG. 4g, subsequent to the shaping process 424 as described above with regard to FIG. 4e, a deposition process 434 may be performed in order to deposit a layer 406 overlying the round-shaped fin 404b. The layer 406 may be at least one of a high-k material or a metal gate. The person skilled in the art will appreciate that the layer 406 may be deposited with a highly conformal thickness across the fin 404b as discussed above. Alternatively, or additionally, an implantation process (not illustrated) may be performed in order to form a desired doping profile within the fin 404b.

With regard to FIGS. 5a-5e, still another illustrative embodiment for fabricating FinFETs according to the present disclosure will be explained.

Figure 5A:
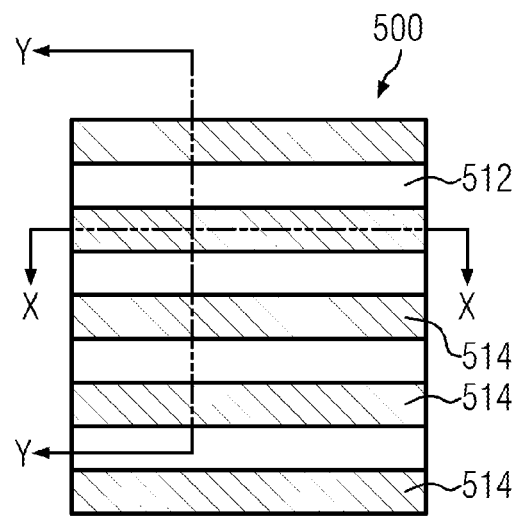
FIGS. 5a-5e schematically illustrate still other process flows for fabricating FinFETs according to illustrative embodiments of the present disclosure.

FIG. 5a illustrates, in a plan view, a portion of a semiconductor device structure 500 at an early stage of formation. The semiconductor device structure 500 may be formed on a bulk semiconductor wafer (reference numeral 510 as illustrated in subsequent figures). An insulating material 512 may separate, delineate, and electrically isolate various fins 514 formed in a surface of the semiconductor substrate 510 (illustrated in subsequent figures). The insulating material 512 may be, for example, part of a shallow trench isolation (STI). STI, as is well known, may include a trench that may be etched into the semiconductor substrate 510 (illustrated in subsequent figures) and may be subsequently filled with an oxide or another insulating material. The insulating material 512 may also extend across different device areas in order to delineate a plurality of spaced-apart fins 514. The fins 514 may be formed by the formation of the STI, but they may not be revealed at this point in the processing. The fins 514 may be revealed later as is explained below. The width and the height of the fins 514 may be adjusted based on the needs of the circuit which is to be implemented when performing a process for revealing the fins 514. According to illustrative examples, fins 514 may be provided having, for example, about 5-50 nm in width and about 5-50 nm in height.

Figure 5B:

FIG. 5b schematically illustrates, in a cross-section taken along line X-X in FIG. 5a, a portion of a device area and of a fin 514 in FIG. 5a. According to some illustrative embodiments, following the formation of the STI 512, conductivity-determining dopant impurities may be implanted into the semiconductor substrate 510 to form a doped well 516. The semiconductor substrate 510 may be silicon, silicon admixed with germanium or carbon, or other semiconductor materials commonly used in the formation of semiconductor device structures 500, but for simplicity will herein simply be referred to as a silicon substrate. The doped well 516 may be doped with N-type dopant impurities, such as arsenic or phosphorous, to form a P-channel FinFET, and may be doped with P-type dopant impurities, such as boron, to form an N-channel FinFET. Areas that are not to be implanted during the well implant step may be masked, for example, with a patterned layer of photoresist. The person skilled in the art will appreciate that multiple implants may be used to tailor the implant dose and dopant profile. The person skilled in the art will appreciate that the undoped silicon in the channel of the transistor may help to overcome short channel effects and threshold variations across the semiconductor device structure.

Figure 5C:
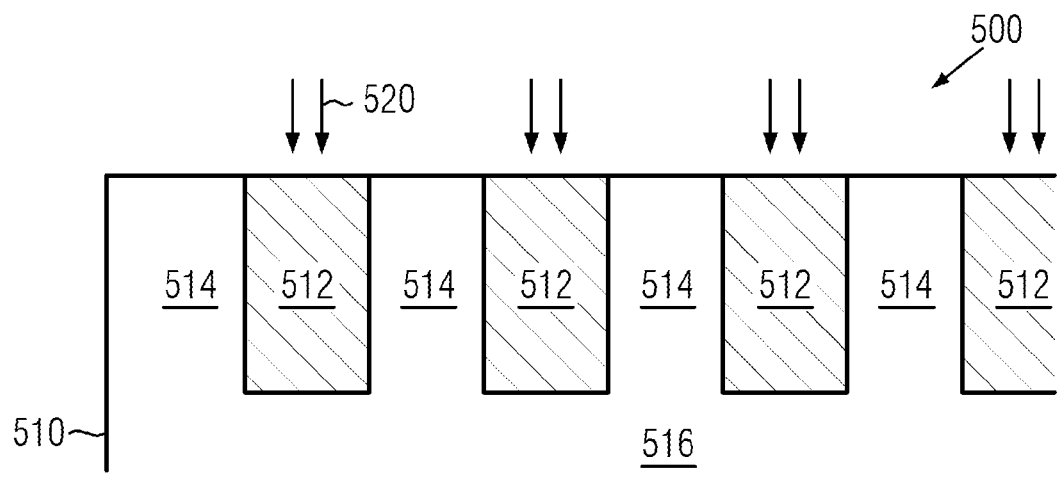

FIG. 5c schematically illustrates, in cross-section taken along line Y-Y in FIG. 5a, a process step 520 for forming the STI 512 by filling an appropriate insulating material into trenches between the fins 514. As it is visible from the illustration in FIG. 5c, the STI 512 may be formed to be substantially even with the fins 514 such that a substantially planar surface is obtained.

Figure 5D:
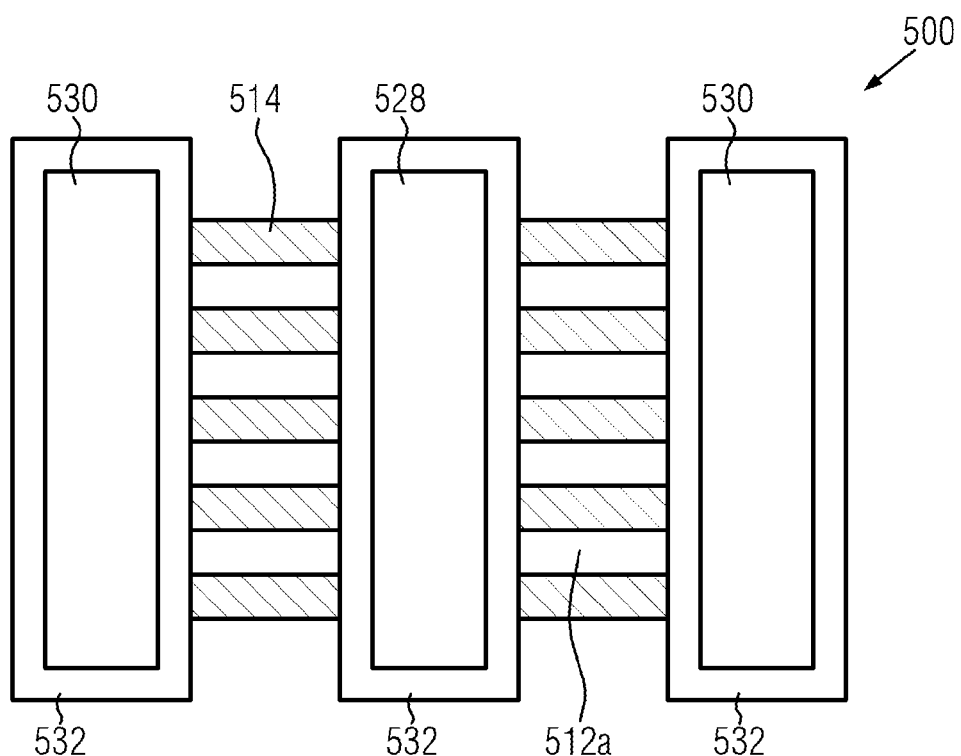

FIG. 5d schematically illustrates, in a plan view, the semiconductor device structure 500 at a later phase during the described illustrative process, i.e., after the formation of gate structures 528 and 530 having sidewall spacers 532. According to the illustrative embodiment explained with regard to FIG. 5d, the gate structures 528 and 530 may represent a dummy gate structure in accordance with replacement gate or gate-last techniques. The gate structures 528 and 530 may be formed overlying the fins 514 and the STI 512a and may be disposed transverse to the fins 514 and the STI 512a as depicted in FIG. 5d. According to the schematic plan view as illustrated in FIG. 5d, the gate structures may mask portions of the fins 514 and the STI 512a. Unmasked portions of the fins 514 and the STI 212a may be exposed between the gate structures 528 and 530 in alignment with the gate structure 528 at both its sides.

Figure 5E:
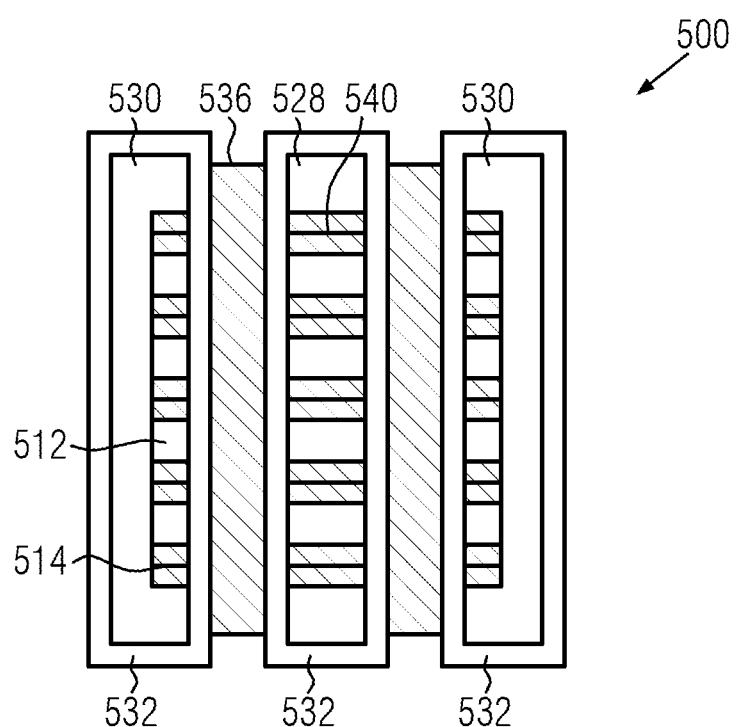

Subsequently, as depicted in FIG. 5e, a masking pattern 536 may be formed in between the gate structures 528 and 530 covering the preceding exposed surfaces of the fins and the STI. Subsequently, a process may be performed for removing the gate material 528 and 530 such that upper portions of the fins 514 underlying the gate structures 528, 530 may be exposed and a depth of the STI 512, and accordingly an effective height of the fins 514, may be adjusted with the exposed portions previously covered by the gate structures 528, 530.

Subsequently, a shaping process may be performed in accordance with the illustrative embodiments as described above with regard to FIGS. 2a-2h in order to shape the exposed portions of the fins 514 within the gate structures 528 and 530. The person skilled in the art will appreciate that, in performing appropriate shaping processes, the exposed upper surfaces of the fins 514 may be substantially reduced to a line as indicated by reference numeral 540, indicating a peaked or a rounded tip portion. Consequently, the exposed portions of the fins 514 may either assume a rounded shape and/or a triangular shape as described above with regard to FIGS. 2a-2h.

The person skilled in the art will appreciate that, in subsequent processing steps, the gate electrode structures 528 and 530 may be filled with high-k material and metal gate material in order to form high-k and metal gate layers of known gate electrode structures. This does not pose any limitation on the present disclosure and the person skilled in the art will appreciate the exposed fins 514 within the gate structure 528, 530 may be of a substantially trapezoidal shape, wherein the line 540 represents exposed upper surfaces of the fins 514 which have a substantially reduced area as compared to the upper surfaces of unshaped fins 514, i.e., fins 514 before a shaping process has been applied.

According to an alternative illustrative embodiment for fabricating FinFETs according to the present disclosure, the etching process as explained with regard to FIGS. 2f-2h above may be performed for forming shaped fins instead of the rectangular fins as described with regard to FIGS. 5a-5e above.

In summary, the present disclosure provides methods for fabricating semiconductor device structures having shaped fin configurations by performing shaping processes that substantially reduce upper surfaces of the fins formed in a semiconductor substrate. According to illustrative embodiments of the present disclosure, fins may be provided having substantially non-vertically aligned sidewall surfaces. According to some special illustrative examples, fins having triangular shapes and/or rounded shapes and/or trapezoidal shapes may be formed.

It is understood that the order of steps may be changed in the above description. In the above description, numerous specific details are set forth such as, for example, thicknesses, in order to provide a more thorough understanding of the present disclosure. Those skilled in the art will realize that the numerous specific details as provided may be equipment specific and may accordingly vary from one brand of equipment to another. It will be obvious, however, to one skilled in the art that the present disclosure may be practiced without these details. In other instances, well-known processes have not been described in detail in order to not unnecessarily obscure the present disclosure.

Although this invention has been described relative to specific insulating materials, conductive materials and deposited materials and etching of these materials, it is not limited to the specific materials but only to their specific characteristics, such as conformal and non-conformal, and capabilities, such as depositing and etching. Other materials may be substituted as is well understood by those skilled in the arts after appreciating the present disclosure.

Given the variety of embodiments of the present disclosure just described, the above description and illustrations shown should not be taken as limiting the scope of the present disclosure or of the present invention as defined by the claims.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, the method comprising:

forming a plurality of trenches in a semiconductor substrate so as to define an initial fin having one of a rectangular shape and a trapezoidal shape, said initial fin comprising sidewalls and an upper surface;

forming regions of insulating material in said plurality of trenches and adjacent to said initial fin, said regions of insulating material covering a lower portion of said initial fin while leaving an upper portion of said initial fin exposed above said regions of insulating material;

forming a spacer structure above said regions of insulating material and adjacent to at least said sidewalls of said exposed upper portion of said initial fin and above the upper surface of the exposed upper portion of the initial fin;

after forming said spacer structure, performing a shaping process in the presence of said spacer structure to shape said exposed upper portion of said initial fin into a shaped fin having a substantially triangular shape or a substantially rounded shape, wherein performing said shaping process comprises performing an etching process on said exposed upper portion of said initial fin, said etching process having etching components acting along a first direction that is normal to an upper surface of the substrate and along a second direction that is perpendicular to the first direction; and forming a layer of high-k material over said shaped fin.

2. The method of claim 1, wherein said shaped fin of substantially rounded shape has a rounded top surface.

3. The method of claim 1, wherein a height of said regions of insulating material is chosen in dependence of a geometry of said shaped fin to be achieved.

4. The method of claim 1, wherein said etching process comprises one of a reactive ion etching process and a plasma etching process.

5. The method of claim 1, wherein said spacer structure further comprises a capping layer covering the upper surface of the exposed upper surface of said initial fin.

6. A method for forming a semiconductor device, the method comprising:

forming a plurality of trenches in a semiconductor substrate so as to define an initial fin having one of a rectangular shape and a trapezoidal shape, said initial fin comprising sidewalls and an upper surface;

forming regions of insulating material in said plurality of trenches and adjacent to said initial fin, said regions of insulating material covering a lower portion of said initial fin while leaving an upper portion of said initial fin exposed above said regions of insulating material;

forming a spacer structure above said regions of insulating material and adjacent to at least said sidewalls of said exposed upper portion of said initial fin and above said upper surface of the exposed upper portion of said initial fin;

after forming said spacer structure, performing a shaping process in the presence of said spacer structure to shape said exposed upper portion of said initial fin into a shaped fin having a substantially triangular shape or a substantially rounded shape, wherein performing said shaping process comprises performing an etching process on said exposed upper portion of said initial fin, said etching process having etching components acting along a first direction that is normal to an upper surface of the substrate and along a second direction that is perpendicular to the first direction, and said etching process comprises one of a reactive ion etching process and a plasma etching process, wherein a height of said regions of insulating material is chosen in dependence of a geometry of said shaped fin to be achieved; and forming a layer of high-k material over said shaped fin.

* * * * *